United States Patent
Schierling et al.

(10) Patent No.: US 12,007,452 B2
(45) Date of Patent: Jun. 11, 2024

(54) LOCATING A GROUND FAULT IN A DC SYSTEM

(71) Applicant: Siemens Aktiengesellschaft, Munich (DE)

(72) Inventors: Hubert Schierling, Erlangen (DE); Benno Weis, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 261 days.

(21) Appl. No.: 17/439,110

(22) PCT Filed: Mar. 6, 2020

(86) PCT No.: PCT/EP2020/056010
§ 371 (c)(1),
(2) Date: Sep. 14, 2021

(87) PCT Pub. No.: WO2020/187608
PCT Pub. Date: Sep. 24, 2020

(65) Prior Publication Data
US 2022/0146594 A1  May 12, 2022

(30) Foreign Application Priority Data
Mar. 18, 2019  (EP) .................................... 19163394

(51) Int. Cl.
*G01R 31/52* (2020.01)
*H02H 1/00* (2006.01)
(Continued)

(52) U.S. Cl.
CPC ........... *G01R 31/52* (2020.01); *H02H 1/0007* (2013.01); *H02H 3/042* (2013.01); *H02H 3/16* (2013.01); *H02H 7/268* (2013.01)

(58) Field of Classification Search
CPC ...... G01R 31/08; G01R 31/086; G01R 31/52; G01R 31/40; G01R 31/50; H02H 1/0007;
(Continued)

(56) References Cited

U.S. PATENT DOCUMENTS 4,739,275 A * 4/1988 Kimball ................. G01R 31/52
324/529
6,101,073 A * 8/2000 Takehara ................. H02H 3/16
363/55
(Continued)

FOREIGN PATENT DOCUMENTS

CN 103219711 A * 7/2013
CN 109387731 B * 2/2021 ........... G01R 31/086
(Continued)

OTHER PUBLICATIONS

PCT International Search Report and Written Opinion of International Searching Authority dated Aug. 12, 2020 corresponding to PCT International Application No. PCT/EP2020/056010 filed Mar. 6, 2020.
(Continued)

*Primary Examiner* — Alexander Satanovsky
*Assistant Examiner* — Trung Q Nguyen
(74) *Attorney, Agent, or Firm* — Harness, Dickey & Pierce, P.L.C.

(57) ABSTRACT

A method is for locating a ground fault in a DC system to which a plurality of load zones can be connected. The method includes specifying a time window and, after the ground fault is detected, assigning the ground fault to a load zone which was connected to the DC system within the time window before the detection of the ground fault.

20 Claims, 1 Drawing Sheet

(51) Int. Cl.
*H02H 3/04* (2006.01)
*H02H 3/16* (2006.01)
*H02H 7/26* (2006.01)

(58) Field of Classification Search
CPC .......... H02H 3/042; H02H 3/16; H02H 7/268; H02H 3/087; H02H 3/105; H02H 3/243; B60L 3/04; B60L 3/0069; B60L 3/12; B60L 2220/42; H02M 5/458; Y02T 10/64
USPC .............................. 324/509, 522, 532; 361/42
See application file for complete search history.

(56) References Cited

U.S. PATENT DOCUMENTS

| | | | | |
|---|---|---|---|---|
| 8,797,042 B2 * | 8/2014 | Ike | ........................ | G01R 31/52 |
| | | | | 324/426 |
| 9,519,016 B2 * | 12/2016 | Satoh | .................... | G01R 31/086 |
| 10,302,688 B2 * | 5/2019 | Hu | ........................ | G01R 31/086 |
| 10,673,225 B2 * | 6/2020 | Eriksen | .................... | H02H 3/00 |
| 10,707,809 B2 * | 7/2020 | Sano | ........................ | G01R 31/52 |
| 10,855,068 B2 * | 12/2020 | Violo | .................... | H01H 83/02 |
| 10,992,129 B2 * | 4/2021 | Hu | ........................ | H02H 3/162 |
| 2012/0182024 A1 * | 7/2012 | Ike | ........................ | G01R 31/52 |
| | | | | 324/509 |
| 2014/0145727 A1 * | 5/2014 | Ike | ........................ | G01R 31/52 |
| | | | | 324/509 |
| 2014/0167779 A1 * | 6/2014 | Si | ........................ | G01R 31/42 |
| | | | | 324/509 |
| 2014/0361784 A1 * | 12/2014 | Satoh | .................... | G01R 31/52 |
| | | | | 324/509 |
| 2016/0154046 A1 * | 6/2016 | Dong | .................... | G01R 31/008 |
| | | | | 324/509 |
| 2017/0131341 A1 * | 5/2017 | Hu | ........................ | G01R 31/086 |
| 2017/0317500 A1 * | 11/2017 | Kumar | .................... | G01R 31/42 |
| 2018/0241200 A1 * | 8/2018 | Hu | ........................ | H02H 3/162 |
| 2018/0366940 A1 * | 12/2018 | Violo | ........................ | H02H 3/33 |
| 2019/0047818 A1 * | 2/2019 | Herkel | ................ | G05B 19/0425 |
| 2019/0131925 A1 * | 5/2019 | Sano | ........................ | H02S 40/32 |
| 2020/0194992 A1 * | 6/2020 | Mandelkau | .......... | H02H 1/0007 |
| 2020/0212959 A1 * | 7/2020 | Eriksen | ................ | H02H 1/0092 |
| 2020/0328694 A1 * | 10/2020 | Telefus | ............. | H02J 13/00007 |
| 2022/0146594 A1 * | 5/2022 | Schierling | ........... | G01R 31/086 |
| 2022/0146595 A1 * | 5/2022 | Schierling | ........... | H02H 3/16 |
| 2022/0170977 A1 * | 6/2022 | Schierling | .............. | H02H 3/042 |

FOREIGN PATENT DOCUMENTS

| | | | | |
|---|---|---|---|---|
| CN | 113795992 A | * | 12/2021 | .......... G01R 31/086 |
| CN | 115545493 A | * | 12/2022 | |
| DE | 112017000074 T5 | * | 4/2018 | ............. G01R 31/02 |
| DE | 102017108822 A1 | * | 10/2018 | .............. G08B 17/06 |
| DE | 102017108822 A1 | | 10/2018 | |
| EP | 3136526 A1 | * | 3/2017 | .......... G01R 31/086 |
| EP | 3713029 A1 | * | 9/2020 | .......... G01R 31/086 |
| EP | 3723220 A1 | * | 10/2020 | .......... G01R 31/086 |
| EP | 3136526 B1 | * | 11/2022 | .......... G01R 31/086 |
| JP | H1075525 A | | 3/1998 | |
| KR | 100384426 B1 | * | 7/2003 | |
| KR | 20050122978 A | * | 12/2005 | |
| WO | WO 2014194941 A1 | | 12/2014 | |
| WO | WO-2014194941 A1 | * | 12/2014 | .......... G01R 31/025 |
| WO | WO-2017032992 A1 | * | 3/2017 | .......... G01R 31/086 |
| WO | WO-2018074394 A1 | * | 4/2018 | ................ B60L 3/00 |
| WO | WO-2018198438 A1 | * | 11/2018 | ................ B60M 3/00 |
| WO | WO-2020187608 A1 | * | 9/2020 | .......... G01R 31/086 |
| WO | WO-2020207730 A1 | * | 10/2020 | .......... G01R 31/086 |

OTHER PUBLICATIONS

European Search Report for European Application No. 19163394 dated Oct. 2, 2019.

* cited by examiner

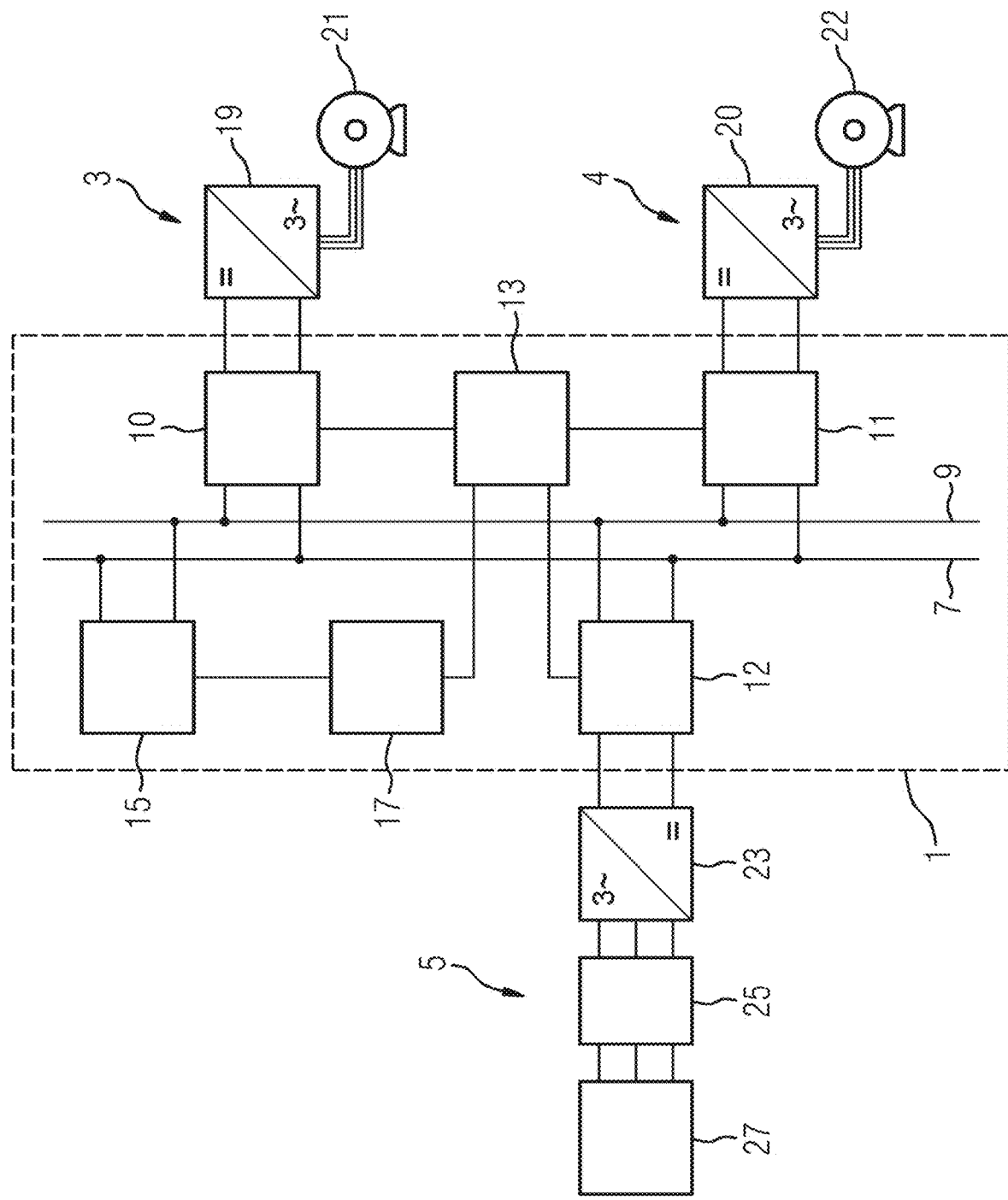

LOCATING A GROUND FAULT IN A DC SYSTEM

PRIORITY STATEMENT

This application is the national phase under 35 U.S.C. § 371 of PCT International Application No. PCT/EP2020/056010 which has an International filing date of Mar. 6, 2020, which claims priority to European patent application EP19163394 filed Mar. 18, 2019, the entire contents of each of which are hereby incorporated herein by reference.

FIELD

Embodiments of the present application generally relate to a method for locating a ground fault in a DC system to which a plurality of load zones are connectable.

BACKGROUND

A DC system which is insulated in relation to a ground potential or is grounded by way of a high impedance can continue to be operated in the event of a ground fault of a DC voltage potential. The ground fault itself can easily be detected during operation by the measurement and evaluation of the voltages between the DC voltage potentials of the DC system and a ground potential. However, it is difficult to identify that load zone which is connected to the DC system and in which the ground fault has occurred. The identification of that load zone in which the ground fault has occurred is important, however, in order to switch off the faulty load zone and to eliminate the ground fault. In order to identify the faulty load zone, a so-called common-mode current, that is to say a fault current that is the sum of the currents in the two lines connecting the load zone to the main lines of the DC system, could be measured for example at a point where each load zone is connected to the DC system, for example at the input of a switchgear cabinet. If one of the common-mode currents is different than zero, this indicates that the ground fault has occurred in the associated load zone. The measurements of the common-mode currents could be carried out for example permanently or manually by maintenance personnel. However, such measurements involve a high outlay in any case.

DE 10 2017 108822 A1 discloses a method for localizing a ground fault of a fire protection system in which, upon or after identification of a ground fault by the ground fault identification module, the connection lines of one, a plurality or all of the connection points are disconnected by switching elements being opened until at least no ground fault is identified by the ground fault identification module. Afterward, the connection lines are connected progressively for each connection point by a respective switching element being closed.

SUMMARY

At least one embodiment of the invention specifies an improved method for locating a ground fault in a DC system to which a plurality of load zones are connectable.

Embodiments of the invention are directed to a method and a DC system.

The claims relate to advantageous configurations of the invention.

In the method according to an embodiment of the invention for locating a ground fault in a DC system to which a plurality of load zones are connectable, a time window is predefined and, after the ground fault has been detected, the ground fault is assigned to a load zone which was connected to the DC system within the time window before the detection of the ground fault. In other words, the ground fault is assigned to a load zone which was connected to the DC system before the ground fault detection with a temporal separation with respect to the ground fault detection which is less than or equal to the predefined time window. It is always assumed here and hereinafter that the DC system is insulated in relation to a ground potential or is grounded by way of a high impedance.

In line with an abovementioned configuration, a first DC system is provided according to an embodiment of the invention to which a plurality of load zones are connectable has an evaluation unit configured to store a detection time for detection of a ground fault, a predefinable time window and also, for each instance of connecting a load zone, a connecting time of the connecting and a connecting assignment of the connecting time to the connected load zone and to assign the ground fault to a load zone which was connected to the DC system within the time window before the detection of the ground fault.

BRIEF DESCRIPTION OF THE DRAWINGS

The above-described properties, features and advantages of embodiments of the invention and the way in which they are achieved will become clearer and more clearly understood in association with the following description of example embodiments which are explained in greater detail in association with the drawing.

The single FIGURE schematically shows a DC system 1 to which a plurality of load zones 3, 4, 5 are connectable.

DETAILED DESCRIPTION OF THE EXAMPLE EMBODIMENTS

In the method according to an embodiment of the invention for locating a ground fault in a DC system to which a plurality of load zones are connectable, a time window is predefined and, after the ground fault has been detected, the ground fault is assigned to a load zone which was connected to the DC system within the time window before the detection of the ground fault. In other words, the ground fault is assigned to a load zone which was connected to the DC system before the ground fault detection with a temporal separation with respect to the ground fault detection which is less than or equal to the predefined time window. It is always assumed here and hereinafter that the DC system is insulated in relation to a ground potential or is grounded by way of a high impedance.

The method according to an embodiment of the invention thus correlates the detection of a ground fault in a DC system with the connecting of a load zone to the DC system in order to locate the load zone in which the ground fault has occurred. The method is based on the consideration that if a ground fault is detected in the DC system directly after a load zone is connected, it is obvious that a ground fault was already present in this load zone before the connecting. In order to determine this load zone, the method provides for predefining a time window in order to correlate the detection of a ground fault with the connecting of a load zone. A ground fault is assigned to a load zone which was connected to the DC system within the predefined time window before the detection of the ground fault. If no load zone was connected to the DC system within the predefined time window before the detection of the ground fault, the ground fault is not assigned to a load zone or has to be located in some other way. A time duration of a few milliseconds, for example, is predefined as the time window. The method is able to be realized very simply and with a low outlay and thus also cost-effectively since only the times of detecting a ground fault and of connecting the load zones have to be evaluated. In order to detect the ground fault, in this case the voltages between a ground potential and DC voltage potentials of the DC system need only be measured at a single location of the DC system.

In one configuration of the method, if a plurality of load zones were connected to the DC system within the time window before the detection of the ground fault, the ground fault is assigned to that one of the load zones which was connected to the DC system the latest within the time window. This configuration of the method makes it possible to locate the ground fault even in the case where two or more load zones were connected to the DC system in quick succession within the predefined time window before the detection of a ground fault.

In a further configuration of the method, the load zone to which the ground fault is assigned is disconnected from the DC system. Furthermore, it can be provided that, after the load zone has been disconnected from the DC system, a check is made to ascertain whether a ground fault is still present in the DC system, and that the assignment of the ground fault to the load zone is canceled and the load zone is connected to the DC system again if a ground fault is still present after the load zone has been disconnected from the DC system. This configuration of the method makes it possible, in particular, to check an effected assignment of a ground fault to a load zone. Specifically, if, after this load zone has been disconnected from the DC system, the ground fault is still present in the DC system, it is obvious that the ground fault is not situated in this load zone but rather elsewhere in the DC system, and so the assignment of the ground fault to the load zone is probably incorrect.

In a further configuration of the method, a detection time of the detection of the ground fault, the time window and also, for each instance of connecting a load zone, a connecting time of the connecting and a connecting assignment of the connecting time to the connected load zone are stored by an evaluation unit and the ground fault is assigned to a load zone based upon these stored data by the evaluation unit. In this case, the evaluation unit can be embodied separately or can be a control unit that controls the connecting of load zones, or a ground fault monitoring unit configured for detecting a ground fault. If the evaluation unit is embodied separately or is the ground fault monitoring unit, for example each connecting time and the connecting assignment thereof are reported to the evaluation unit by a control unit that controls the connecting of load zones. If the evaluation unit is embodied separately or is the control unit, for example the ground fault is detected by a ground fault monitoring unit and reported to the evaluation unit.

In the abovementioned configurations of the method, the times of detecting a ground fault and of connecting load zones are thus stored and evaluated by an evaluation unit. In this case, the evaluation unit can advantageously be embodied as a control unit that controls the connecting of load zones, or as a ground fault monitoring unit configured for detecting a ground fault, particularly if such units are provided anyway in the DC system.

In an alternative configuration of the method, the DC system has for each load zone a connecting unit assigned to the load zone, the load zone being connectable to the DC system by the connecting unit, and each connecting unit stores the time window and determines, for each instance of connecting the load zone to which the connecting unit is assigned, whether the connecting was effected within the time window before the detection of the ground fault. For example, the ground fault is detected by a ground fault monitoring unit and reported to each connecting unit, or each connecting unit is configured to detect a ground fault independently.

Therefore, instead of an evaluation unit that evaluates the times of connecting all the load zones, the abovementioned configurations of the method provide for these times to be evaluated for each load zone separately by a connecting unit of the respective load zone. In addition, provision can be made for the connecting units also to detect a ground fault in the DC system independently.

In a further configuration of the method, after a ground fault has been detected, firstly all the load zones are disconnected from the DC system. Then load zones are connected to the DC system successively at mutually different connecting times in each case for a connected duration that is longer than the time window and does not overlap the connected duration of another load zone, and for each instance of connecting a load zone a check is made to ascertain whether a ground fault occurs within the time window after the connecting. This configuration of the method allows a systematic search for that load zone in which a ground fault has occurred.

In line with an abovementioned configuration, a first DC system is provided according to an embodiment of the invention to which a plurality of load zones are connectable has an evaluation unit configured to store a detection time for detection of a ground fault, a predefinable time window and also, for each instance of connecting a load zone, a connecting time of the connecting and a connecting assignment of the connecting time to the connected load zone and to assign the ground fault to a load zone which was connected to the DC system within the time window before the detection of the ground fault.

In line with a likewise abovementioned configuration of the method according to the invention, a second DC system according to the invention to which a plurality of load zones are connectable has for each load zone a connecting unit assigned to the load zone, the load zone being connectable to the DC system by the connecting unit and the latter being configured to store a predefinable time window and to determine, for each instance of connecting the load zone to which the connecting unit is assigned, whether the connecting was effected within the time window before the detection of the ground fault.

Specific embodiments of the present invention will be described below with reference to the drawing.

In this case, the single FIGURE schematically shows a DC system 1 to which a plurality of load zones 3, 4, 5 are connectable. The DC system 1 is insulated in relation to a ground potential or is grounded by way of a high impedance.

The DC system 1 has two main electrical lines 7, 9, a plurality of connecting units 10 to 12, a control unit 13, a ground fault monitoring unit 15 and an evaluation unit 17.

By way of example, three load zones 3, 4, 5 are illustrated in the FIGURE. A first load zone 3 and a second load zone 4 each have a power converter 19, 20 and an electrical machine 21, 22. A third load zone 5 has a power converter 23, a switching and protection unit 25 for AC current and an AC system 27, wherein the switching and protection unit 25 is connected between the AC system 27 and the power converter 23. Each power converter 19, 20, 23 is connected to a connecting unit 10, 11, 12.

A first main line 7 is at a first DC voltage potential of the DC system 1. The second main line 9 is at a second DC voltage potential of the DC system 1.

Each connecting unit 10, 11, 12 is assigned to a load zone 3, 4, 5 which is connectable to the DC system 1 by the connecting unit 10, 11, 12.

The control unit 13 controls the connecting of the load zones 3, 4, 5. For this purpose, the connecting units 10, 11, 12 are controllable by the control unit 13. Furthermore, the control unit 13 is designed to report to the evaluation unit 17, for each instance of connecting a load zone 3, 4, 5, a connecting time of the connecting and a connecting assignment of the connecting time to the connected load zone 3, 4, 5.

The ground fault monitoring unit 15 is configured to detect a ground fault of a DC voltage potential of the DC system 1. For this purpose, the ground fault monitoring unit 15 is connected to each main line 7, 9 and is configured to measure the voltages between a ground potential and the DC voltage potentials of the main lines 7, 9. Furthermore, the ground fault monitoring unit 15 is configured to report a detected ground fault to the evaluation unit 17.

The evaluation unit 17 is configured to store the detection time of the detection of a ground fault, a predefinable time window and also the connecting times and connecting assignments reported to the evaluation unit by the control unit 13, and to assign the ground fault to a load zone based upon these stored data. In this case, the ground fault is assigned to a load zone 3, 4, 5 which was connected to the DC system 1 within the time window before the detection of the ground fault. If no load zone 3, 4, 5 was connected to the DC system 1 within the time window before the detection of the ground fault, the ground fault is not assigned to a load zone 3, 4, 5 by the evaluation unit 17. If a plurality of load zones 3, 4, 5 were connected to the DC system 1 within the time window before the detection of the ground fault, the evaluation unit 17 assigns the ground fault to that one of the load zones 3, 4, 5 which was connected to the DC system 1 the latest within the time window. By way of example, a time duration of a few milliseconds is predefined as the time window and stored by the evaluation unit 17.

The example embodiments of a DC system 1 according to the invention and of the method according to the invention which have been described with reference to the FIGURE can be modified in various ways to form further example embodiments.

By way of example, provision can be made for the connecting times and connecting assignments of the load zones 3, 4, 5 to be reported to the evaluation unit 17 by the connecting units 10, 11, 12 rather than by the control unit 13.

Furthermore, it can be provided for example that the load zone 3, 4, 5 to which the ground fault is assigned is disconnected from the DC system 1 by the connecting unit 10, 11, 12 assigned to the load zone, and that, after the load zone 3, 4, 5 has been disconnected from the DC system 1, a check is made to ascertain whether a ground fault is still present. If a ground fault is still present after the load zone 3, 4, 5 has been disconnected from the DC system 1, the assignment of the ground fault to the load zone 3, 4, 5 is canceled and the load zone 3, 4, 5 is connected to the DC system again.

Furthermore, in the case of a ground fault, it can be provided that after the ground fault firstly all the load zones 3, 4, 5 are disconnected from the DC system 1 by their connecting units 10, 11, 12. This is followed by systematically searching for the faulty load zone 3, 4, 5 by a procedure in which load zones 3, 4, 5 are connected to the DC system 1 successively at mutually different connecting times in each case for a connected duration that is longer than the time window and does not overlap the connected duration of another load zone 3, 4, 5, and for each instance of connecting a load zone 3, 4, 5 a check is made to ascertain whether a ground fault occurs within the time window after the connecting.

Furthermore, instead of a separate evaluation unit 17, provision can be made for the control unit 13 or the ground fault monitoring unit 15 to be designed as the evaluation unit 17. In the case where the control unit 13 is designed as the evaluation unit 17, a ground fault is reported to the control unit 13 by the ground fault monitoring unit 15 and the control unit 13 is configured, in the event of a ground fault, to check whether a load zone 3, 4, 5 was connected to the DC system 1 within the time window before the detection of the ground fault. In the case where the ground fault monitoring unit 15 is designed as the evaluation unit 17, the connecting times and connecting assignments of the load zones 3, 4, 5 are reported to the ground fault monitoring unit 15 by the control unit 13 or the connecting units 10, 11, 12 and the ground fault monitoring unit 15 is configured, in the event of a ground fault, to check whether a load zone 3, 4, 5 was connected to the DC system 1 within the time window before the detection of the ground fault.

Furthermore, instead of an evaluation unit 17, it can be provided that, in the event of a ground fault, each connecting unit 10, 11, 12 independently determines whether the load zone 3, 4, 5 to which the connecting unit 10, 11, 12 is assigned was connected within the time window before the detection of the ground fault. In this case, each connecting unit 10, 11, 12 is configured to store the time window and the connecting times of the load zone 3, 4, 5 to which the connecting unit 10, 11, 12 is assigned and, in the case of a ground fault, to check whether a connecting time is within the time window before the detection of the ground fault. Either the ground fault is reported to all the connecting units 10, 11, 12 by the ground fault monitoring unit 15 or each connecting unit 10, 11, 12 is designed to detect a ground fault independently.

Although the invention has been more specifically illustrated and described in detail by way of preferred example embodiments, nevertheless the invention is not restricted by the examples disclosed and other variations can be derived therefrom by the person skilled in the art, without departing from the scope of protection of the invention.

The invention claimed is:

1. A method for locating a ground fault in a DC system to which a plurality of load zones are connectable, the method comprising:
   defining a time window; and
   assigning, after detection of the ground fault, the ground fault to a load zone connected to the DC system, within the time window defined before detection of the ground fault, wherein
      upon the plurality of load zones being connected to the DC system within the time window defined before the detection of the ground fault, the ground fault is assigned to one of the plurality of load zones connected to the DC system relatively latest within the time window.

2. The method of claim 1, further comprising:
   disconnecting, from the DC system, the load zone of the plurality of load zones to which the ground fault is assigned.

3. The method of claim 2, further comprising:
checking, after disconnection of the load zone from the DC system, to ascertain whether the ground fault is still present, and
upon the checking indicating that the ground fault is still present in the DC system after disconnection of the load zone from the DC system, canceling the assigning of the ground fault to the load zone and reconnecting the load zone to the DC system.

4. The method of claim 1, further comprising:
storing, by an evaluation unit, a detection time of the detection of the ground fault, the time window and, for each instance of connecting a load zone, a connecting time of the connecting and a connecting assignment of the connecting time to the load zone connected, and wherein
the ground fault is assigned to the load zone based upon stored data.

5. The method of claim 4, wherein the evaluation unit is a control unit configured to control the connecting of the load zone.

6. The method of claim 4, wherein the evaluation unit is a ground fault monitoring unit configured to detect the ground fault.

7. The method of claim 4, further comprising:
reporting, by a control unit, the connecting time and the corresponding connecting assignment to the evaluation unit to control the connecting of the load zone.

8. The method of claim 4, wherein the ground fault is detected by a ground fault monitoring unit and reported to the evaluation unit.

9. The method of claim 1, wherein the DC system has, for each of the plurality of load zones, a respective connecting unit assigned to a respective load zone of the plurality of load zones, the respective load zone being connectable to the DC system by the respective connecting unit, and each respective connecting unit being configured to store the time window and determine, for each instance of connecting the respective load zone, whether the connecting was effected within the time window before the detection of the ground fault.

10. The method of claim 9, wherein the ground fault is detected by a ground fault monitoring unit and reported to each respective connecting unit.

11. The method of claim 9, wherein each respective connecting unit is configured to detect the ground fault.

12. The method of claim 1, wherein, after the ground fault has been detected, the ground fault cannot be assigned to a load zone of the plurality of load zones because no load zone was connected to the DC system within the time window before the detection of the ground fault, wherein a faulty load zone is determined by a procedure in which firstly all the plurality of load zones are disconnected from the DC system and then each respective load zones of the plurality of load zones are connected to the DC system at mutually different connecting times for a connected duration that is relatively longer than the time window and does not overlap the connected duration of another load zone of the plurality of load zones, and for each instance of connecting a respective load zone, a check is made to ascertain whether the ground fault occurs within the time window after the connecting.

13. A DC system comprising:
an evaluation unit, the evaluation unit configured to
store data of a detection time for detection of a ground fault,
define a time window and, for each respective instance of connecting a load zone of a plurality of load zones, a respective connecting time of the connecting the load zone and a respective connecting assignment of the respective connecting time to the load zone connected, and
assign, after detection of the ground fault, the ground fault to the respective load zone based upon the stored data.

14. The DC system of claim 13, wherein
the plurality of load zones are connectable via respective connecting units;
the DC system further includes a ground fault monitoring unit; and
the ground fault monitoring unit is configured to report a detected ground fault to the evaluation unit.

15. A DC system, comprising:
main electrical lines;
a ground fault monitoring unit connected to the main electrical lines;
a plurality of connectable load zones; and
for each respective load zone of the plurality of connectable load zones, a respective connecting unit assigned to each respective connectable load zone, each respective connectable load zone being connectable to the DC system by each respective connecting unit and each respective connecting unit being configured to
store a definable time window, and
determine, for each instance of connecting the respective connectable load zone, whether the connecting was affected within the definable time window before reporting of a ground fault by the ground fault monitoring unit.

16. A method for locating a ground fault in a DC system to which a plurality of load zones are connectable, the method comprising:
defining a time window; and
assigning, after detection of the ground fault, the ground fault to a load zone connected to the DC system, within the time window defined before detection of the ground fault; and
storing, by an evaluation unit, a detection time of the detection of the ground fault, the time window and, for each instance of connecting a load zone, a connecting time of the connecting and a connecting assignment of the connecting time to the load zone connected, wherein
the ground fault is assigned to the load zone based upon stored data.

17. The method of claim 16, wherein the evaluation unit is a control unit configured to control the connecting of the load zone.

18. The method of claim 16, wherein the evaluation unit is a ground fault monitoring unit configured to detect the ground fault.

19. The method of claim 16, further comprising:
reporting, by a control unit, the connecting time and the corresponding connecting assignment to the evaluation unit to control the connecting of the load zone.

20. The method of claim 16, wherein the ground fault is detected by a ground fault monitoring unit and reported to the evaluation unit.

* * * * *